(12) United States Patent
Wu et al.

(10) Patent No.: US 11,637,012 B2
(45) Date of Patent: Apr. 25, 2023

(54) METHOD FOR FABRICATING THICK DIELECTRIC FILMS USING STRESS CONTROL

(71) Applicant: The Hong Kong University of Science and Technology, Hong Kong (CN)

(72) Inventors: Kaiyi Wu, Hong Kong (CN); Andrew Wing-On Poon, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 196 days.

(21) Appl. No.: 17/029,886

(22) Filed: Sep. 23, 2020

(65) Prior Publication Data

US 2021/0098247 A1    Apr. 1, 2021

Related U.S. Application Data

(60) Provisional application No. 62/973,277, filed on Sep. 27, 2019.

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *G02B 6/12007* (2013.01);
(Continued)

(58) Field of Classification Search
None
See application file for complete search history.

(56) References Cited

U.S. PATENT DOCUMENTS

| 6,774,059 B1 | 8/2004 | Chuang et al. |
| 8,538,223 B2 | 9/2013 | Zhang et al. |

(Continued)

FOREIGN PATENT DOCUMENTS

| CN | 103484833 A | 1/2014 |
| CN | 106876249 A | 6/2017 |
| CN | 107507768 A | 12/2017 |

OTHER PUBLICATIONS

Munoz, Pascual, et al., "Foundry Developments Toward Silicon Nitride Photonics from Visible to the Mid-Infrared", IEEE Journal of Selected Topics in Quantum Electronics, vol. 25, No. 5. 13 pages total, (Sep./Oct. 2019).

(Continued)

*Primary Examiner* — Asok K Sarkar
(74) *Attorney, Agent, or Firm* — Leydig, Voit & Mayer, Ltd.

(57) ABSTRACT

A method for fabricating a thick crack-free dielectric film on a wafer for device fabrication is disclosed herein. A stress-release pattern is fabricated in an oxide layer of the wafer, which surrounds a number of device regions. The stress-release pattern comprises a plurality of recessions, which are spaced periodically along at least one direction. The plurality of recessions interrupt the continuous film during the dielectric film deposition, to prevent cracks from forming in the dielectric film and propagating into the device regions. Such that, a thick crack-free dielectric film can be achieved in the device regions, which are formed by patterning the dielectric layer. Furthermore, conditions of the dielectric film deposition process can be tuned to ensure quality of the deposited dielectric film. Still further, a plurality of deposition runs may be performed to deposit the thick crack-free dielectric film.

18 Claims, 10 Drawing Sheets

(51) Int. Cl.
   H01L 23/31     (2006.01)
   G02B 6/132     (2006.01)
   G03F 7/20      (2006.01)
   G02B 6/12      (2006.01)
   G02B 6/293     (2006.01)

(52) U.S. Cl.
   CPC .............. *G02B 6/132* (2013.01); *G03F 7/70* (2013.01); *H01L 21/0217* (2013.01); *H01L 23/3192* (2013.01); *G02B 6/29341* (2013.01)

(56) References Cited

U.S. PATENT DOCUMENTS

| | | | |
|---|---|---|---|
| 10,191,215 | B2 | 1/2019 | Kippenberg et al. |
| 2003/0104649 | A1 | 6/2003 | Ozgur et al. |
| 2016/0327743 | A1 | 11/2016 | Kippenberg et al. |

OTHER PUBLICATIONS

Weigel, P.O., et al., "Reducing the thermal stress in a heterogeneous material stack for large-area hybrid optical silicon-lithium niobate waveguide microchips", Optical Materials, vol. 66, pp. 605-610 (2017).

Nabki, Frederic, et al., "Low-Stress CMOS-Compatible Silicon Carbide Surface-Micromachining Technology—Part I: Process Development and Characterization", Journal of Microelectromechanical Systems, vol. 20, No. 3, pp. 720-729, (Jun. 2011).

Yao, Zhanshi, et al., "Integrated Silicon Photonic Microresonators: Emerging Technologies", IEEE Journal of Selected Topics in Quantum Electronics, vol. 24, No. 6, (24 pages total) (Nov./Dec. 2018).

Guan, Dong, "Fabrication of Stress Controlled Silicon Oxide for Free-Standing MEMS Devices", Massachusetts Institute of Technology, 101 pages total, (Jun. 2014).

Kruckel, Clemens, J., et al. "Linear and Nonlinear Characterization of Low-Stress High-Confinement Silicon-Rich Nitride Waveguides", Optical Society of America, vol. 23, No. 20 (Oct. 5, 2015).

Dirani, Houssein El, et al., Annealing-free $Si_3N_4$ frequency combs for monolithic Integration with Si photonics, Applied Physics Letters, American Institute of Physics, vol. 113, No. 8, pp. 081102-1-081102-5 , (Aug. 2018).

Pfeiffer, Martin, H.P., et al., "Photonic Damascene process for integrated high-Q microresonator based nonlinear photonics," Optica, vol. 3, Issue 1, pp. 20-25 (2016).

Dirani, Houssein El, "Ultralow-loss tightly confining $Si_3N_4$ waveguides and High-Q microresonators" Optic Express, vol. 27, No. 21/14, pp. 30726-30740 (Oct. 2019).

Gondarenko, Alexander, et al., "High confinement micron-scale silicon nitride high Q ring resonator," Optics Express, vol. 17, No. 14, pp. 11366-11370, (Jul. 6, 2009).

Ji, Xingchen, et al., "Ultra-low-loss on-chip resonators with sub-milliwatt parametric oscillation threshold," Optica Society of America, vol. 4, No. 6, pp. 619-624, (Jun. 2017).

Luke, Kevin., et al. "Overcoming $Si_3N_4$ film stress limitations for high quality factoring resonators," Opt. Express 21(19), pp. 22829-22833 (2013).

Pfeiffer, Martin, H.P., et al., "Ultra-smooth silicon nitride waveguides based on the Damascene reflow process: fabrication and loss origins," Optica, vol. 5, No. 7, pp. 884-892, (Jul. 2018).

Pfeiffer, Martin, H.P., et al., "Photonic Damascene Process for Low-Loss, High-Confinement Silicon Nitride Waveguides," IEEE J. Sel. Topics Quantum, vol. 24, No. 4, pp. 1-11 884 (Jul./Aug. 2018).

Xuan, Yi, et al., "High-Q silicon nitride microresonators exhibiting low-power frequency comb initiation," Optica, vol. 3, No. 11, pp. 1171-1180, (Nov. 2016).

Wu, Kaiyi et al., "Stress-released $Si_3N_4$ fabrication process for dispersion-engineered integrated silicon photonics," Optics Express, vol. 28. No. 12, pp. 17708-17722, (Jun. 2020).

Kaiyi, Wu, PhD thesis "High Quality-factor $Si_3N_4$ Microserseonators towards Integrated Nonlinear and Quantum Light Sources", submitted on May 11, 2020 and presented on May 21, 2020, 100 pages total.

Casale, Marco, et al., "Low-Temperature Crack-Free $Si_3N_4$ Nonlinear Photonic Circuits for CMOS-Compatible Optoelectronic Cointegration", Proceedings of the SPIE, vol. 10106, Integrated Optics: Devices, Materials and Technologies XXI, 1010608, pp. 1-7 (Feb. 16, 2017).

Wu, Kaiyi et al. "Dispersion Engineering of High-Q $Si_3N_4$ Microdisk Resonators," in 2018 Proc. Conf. Lasers Electro-Opt., San Jose, CA, USA, (2018), Paper SW4B.4, 2 pages total.

Dirani, Houssein El, et al., "Crack-Free Silicon-Nitride-on-Insulator Nonlinear Circuits for Continuum Generation in the C-Band," IEEE Photonics Technology Letters, Institute of Electrical and Electronics Engineers, vol. 30, No. 4, pp. 355-358 (Feb. 15, 2018).

Senturia, Stephen D., "Microsystem Design", relevant p. 196, Spring Science & Business Media, 13 pages total, (2007).

 Si₃N₄
 SiO₂
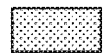 Si
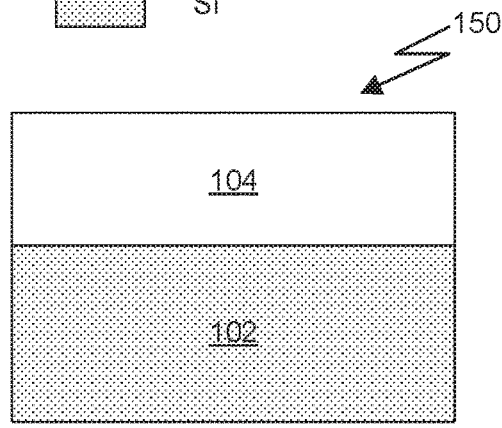
*Fig. 1A*
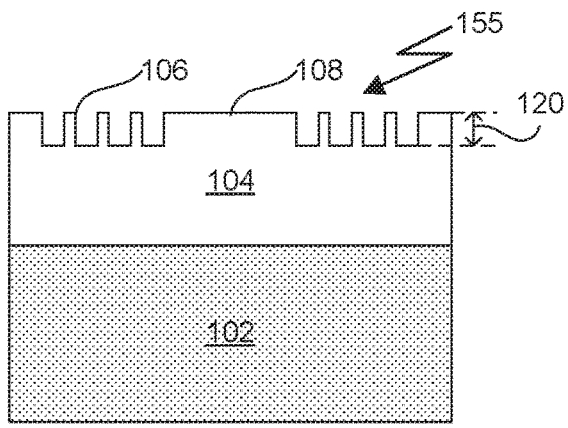
*Fig. 1B*
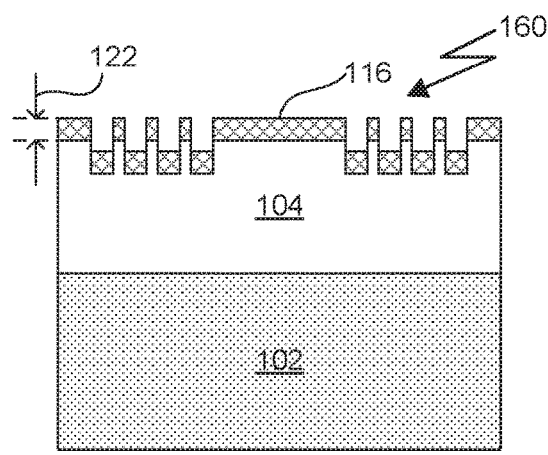
*Fig. 1C*
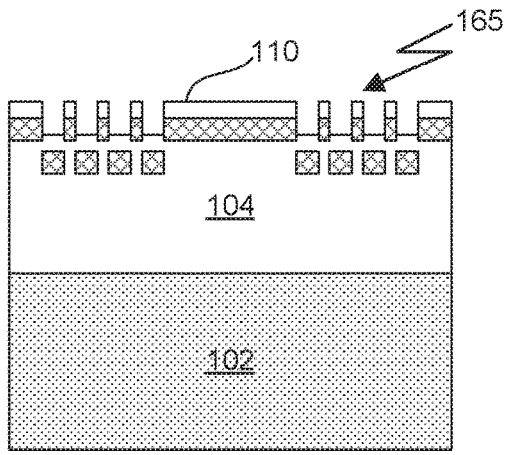
*Fig. 1D*
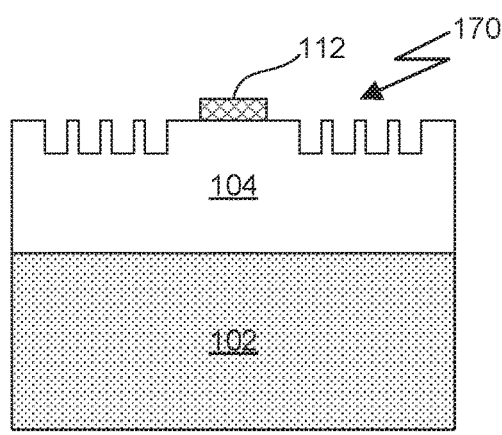
*Fig. 1E*
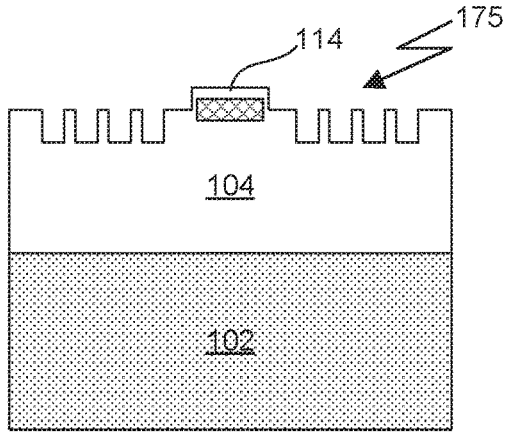
*Fig. 1F*

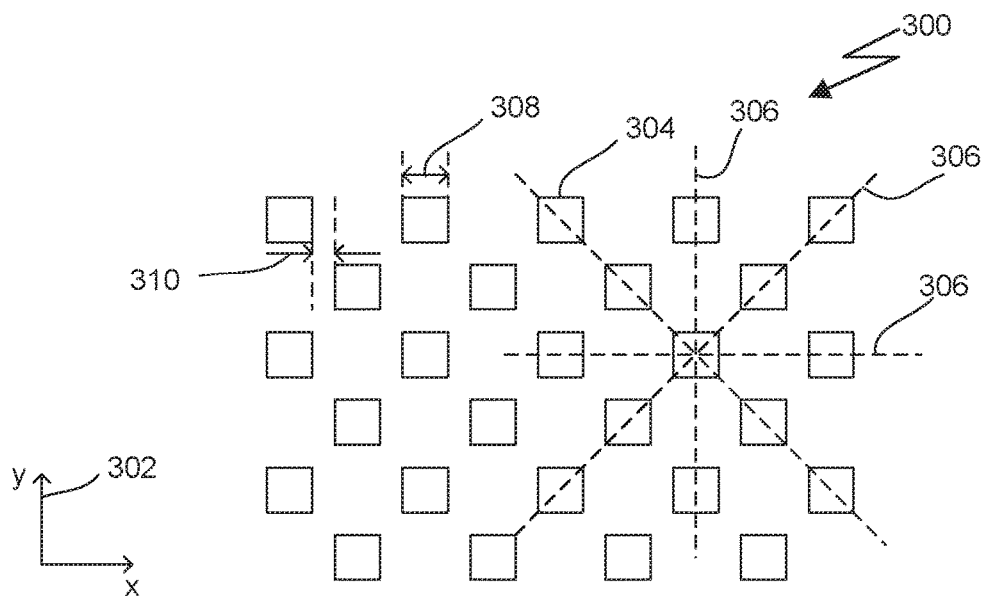
Fig. 3A
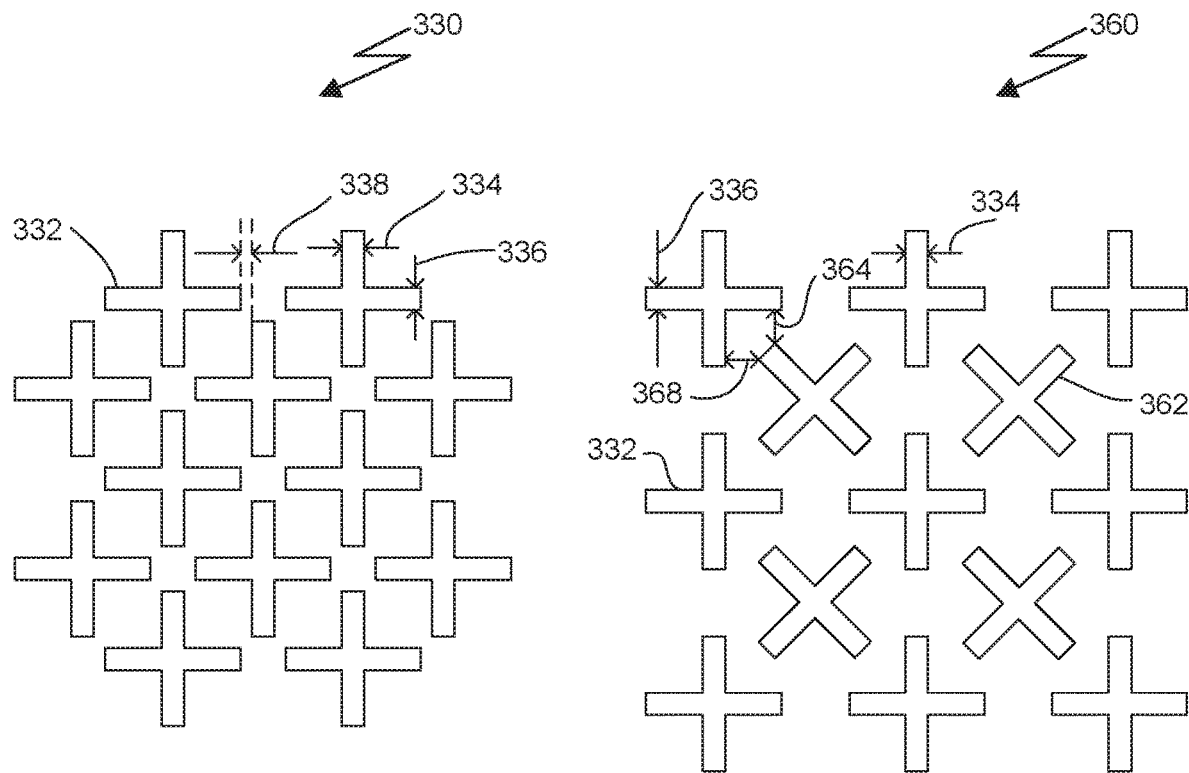
Fig. 3B
Fig. 3C

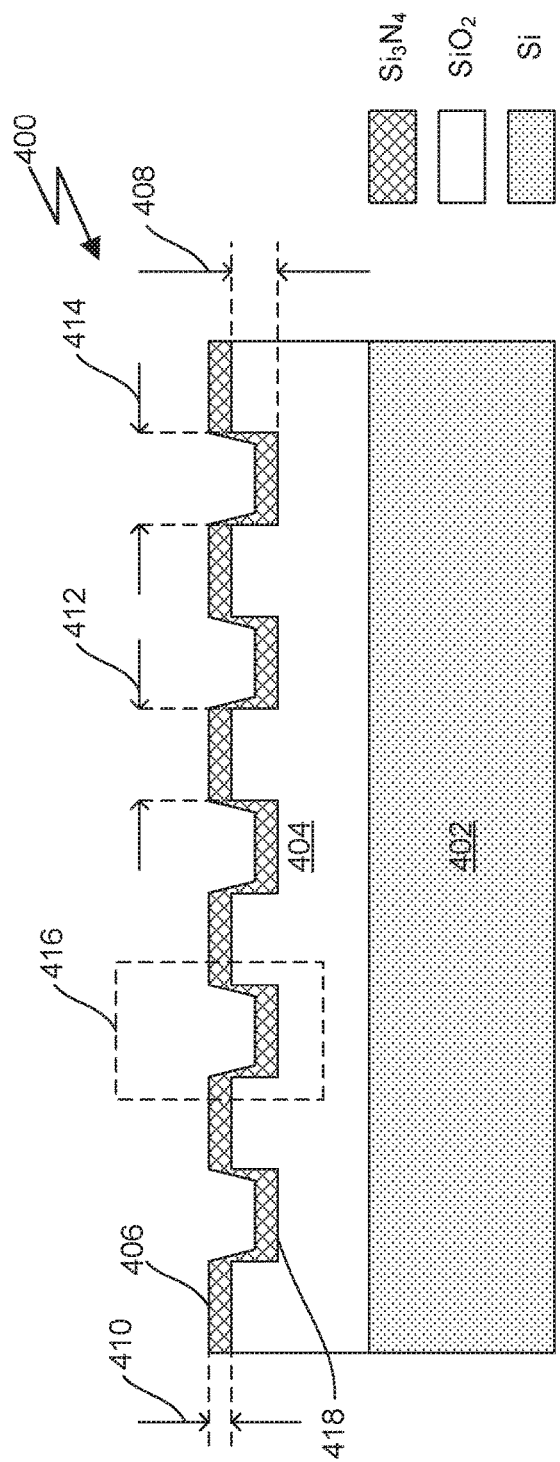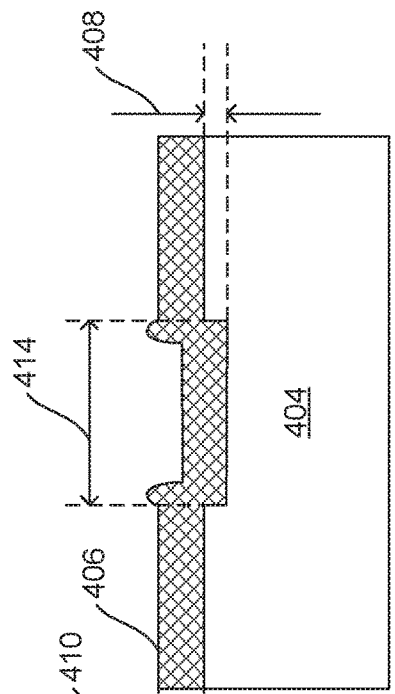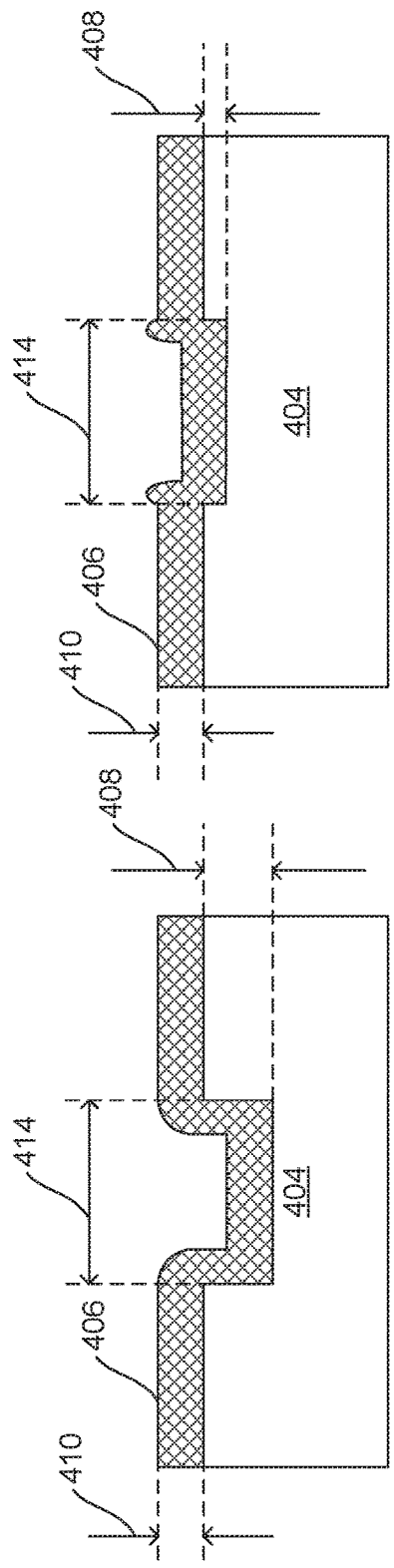

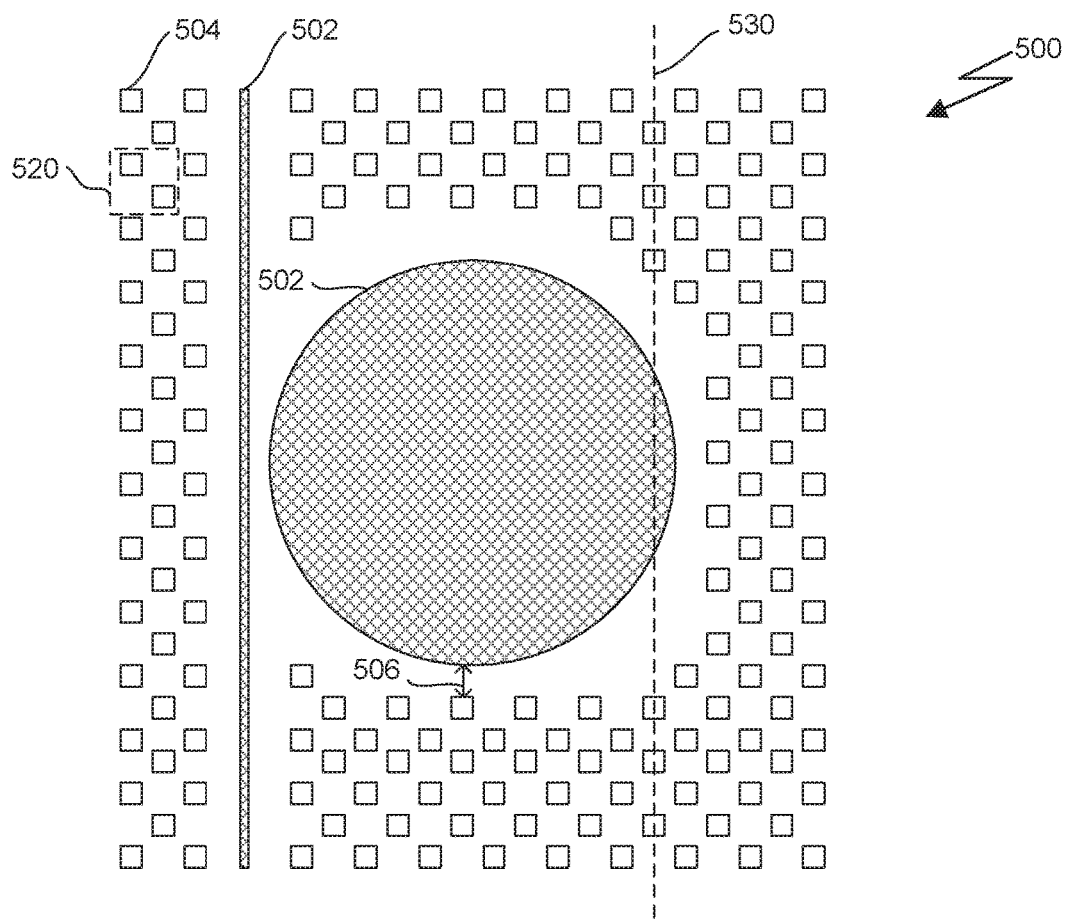
*Fig. 5A*
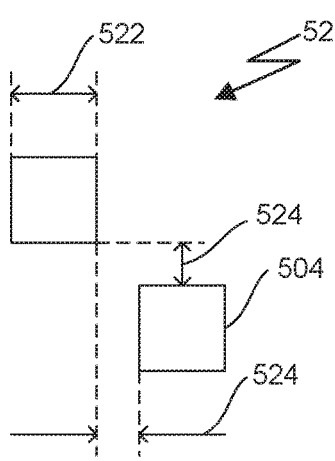
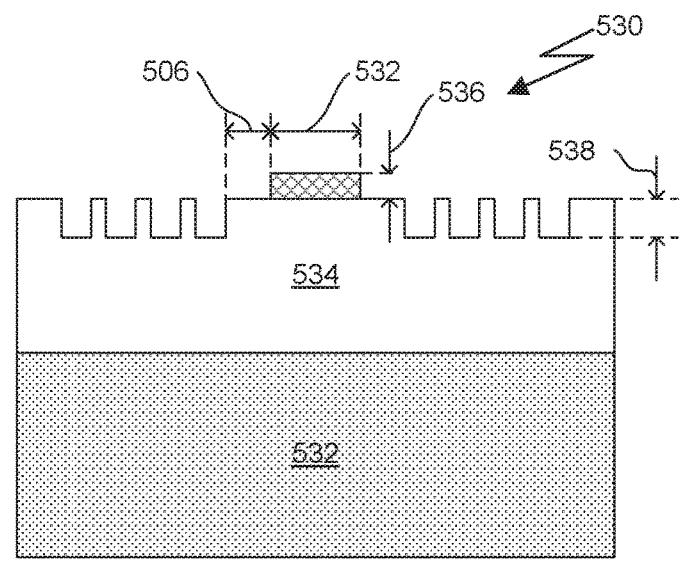
*Fig. 5B*  *Fig. 5C*

METHOD FOR FABRICATING THICK DIELECTRIC FILMS USING STRESS CONTROL

CLAIM OF PRIORITY

This application claims the benefit of U.S. Provisional Application No. 62/973,277 titled "METHOD FOR FABRICATING THICK DIELECTRIC FILMS USING STRESS CONTROL," filed Sep. 27, 2019, the entire contents of which is incorporated herein by reference.

TECHNICAL FIELD

The present disclosure relates to fabrication of integrated devices requiring stress control. More specifically, the disclosure is directed to fabrication of devices on a crack-free, thick stoichiometric silicon nitride ($Si_3N_4$) film deposited on a silica-clad silicon wafer.

BACKGROUND

Silicon-based photonic integrated circuits that leverage the strong optical third-order nonlinearity of the silicon-based materials and the enhanced optical intensities in tightly confined structures have attracted recent research and development interest for realizing energy-efficient optical nonlinear and quantum sources on a chip. Among the three traditional silicon complementary-metal-oxide-semiconductor (CMOS) materials (i.e., silicon, silica, and silicon nitride), silicon nitride exhibits smaller linear and nonlinear optical absorption losses compared to silicon, and a third-order optical nonlinearity that is an order of magnitude larger than that of silica. Stoichiometric silicon nitride (i.e., $Si_3N_4$) deposited via low-pressure chemical vapor deposition (LPCVD) provides a smaller material absorption loss in the 1550 nm telecommunications band compared to $SiN_x$ deposited via plasma-enhanced chemical vapor deposition due to a lower content of N—H bonds that absorb light at approximately 1520 nm wavelengths. Thus, $Si_3N_4$ is preferred to $SiN_x$ for the 1550 nm telecommunications band. Given the lower loss, $Si_3N_4$ optical microring resonators have demonstrated high quality (Q) factors exceeding 107, with a sub-milliwatt threshold power for nonlinear optical parametric oscillation.

In the field of silicon photonics, it has been observed that a thick $Si_3N_4$ film thickness exceeding 700 nm is required in order to engineer the waveguide dispersion for optical nonlinear frequency conversions. However, a thick $Si_3N_4$ film deposited by LPCVD exhibits a large tensile stress, which tends to form cracks across the entire wafer. This limits the film thickness to typically less than 400 nm.

Researchers have developed a temperature-cycling method along with manually scribed trenches to stop cracks from propagating into the center device region of approximately 50 mm×50 mm in order to grow a thick $Si_3N_4$ film of approximately 910 nm. The film deposition with a thickness exceeding 400 nm is performed in multiple cycles, with the temperature cooling down to room temperature and the wafer pulled out from the furnace in between cycles. However, such a process cannot effectively stop cracks once they are formed inside the device region. A layer of silicon oxinitride is also likely to be formed when the wafer is exposed to air in between cycles.

The recently developed photonic Damascene process utilizes an additive fabrication process, where $Si_3N_4$ is deposited after etching the negative pattern of the waveguides in the oxide layer. The waveguides are surrounded by a carefully designed dense filler pattern on the underneath oxide layer. A 1.5 µm-thick $Si_3N_4$ film with waveguide-based devices has been demonstrated. However, the photonic Damascene process is not a standard CMOS process and imposes an additional chemical-mechanical polishing (CMP) step for forming $Si_3N_4$ devices. The CMP process can potentially induce mechanical shock that can form cracks and hinder the fabrication of larger-area devices such as disk resonators. In addition, the local deviation of the CMP removal rate imposes limitations to a well-controlled device height.

Another crack-free process for depositing LPCVD nitride-based films on 6-inch and 8-inch wafers requires rotating the wafer by 45° in between the film deposition in order to redistribute the uniaxial strain. The film deposition is carried out in two steps, with a 365 nm-thick $Si_3N_4$ film deposited in each step. Each deposition run is performed at 780° C., with post-deposition cooling to around 630° C. for 20 minutes. This fabrication method enables a relatively thick crack-free $Si_3N_4$ film demonstrated up to a thickness of 730 nm. However, rotation of a wafer by 45° inside the furnace is a non-standard procedure.

There is a need for addressing these issues or other issues associated with deposition of thick crack-free dielectric films.

SUMMARY

A thick, crack-free dielectric film fabricated on a silicon wafer is needed for the manufacture of various types of semiconductor devices. The present disclosure provides solutions for fabricating a large-area, thick, crack-free dielectric film on silica substrate for fabricating devices and circuits.

In a first aspect of the present disclosure, a method is described for fabricating a dielectric film on a wafer. The method includes the steps of: fabricating a predefined pattern in an oxide layer of the wafer to define a number of device regions on the top surface of the wafer; depositing the dielectric film on the oxide layer; and patterning the dielectric film to form the number of device regions. The predefined pattern is patterned by a photolithography process, and the predefined pattern includes a plurality of recessions in the oxide layer in a portion of the wafer surrounding each of the number of device regions.

In some embodiments, the plurality of recessions include a first set of linear recessions extending along a first direction and spaced periodically or quasi-periodically along a second direction. Furthermore, the plurality of recessions may include a second set of linear recessions extending along the second direction and spaced along the first direction. Still further, the second direction may be orthogonal to the first direction.

In some embodiments, a width of each linear recession of the predefined pattern is larger than twice the target thickness of the dielectric film.

In some embodiments, a thickness of the dielectric film is smaller than a depth of the plurality of recessions in the oxide layer.

In some embodiments, a predefined spacing separates each device region from the predefined pattern and the predefined spacing is at least 1 micrometers.

In some embodiments, the plurality of recessions include an array of square-shaped recessions. Each square-shaped recession is separated from other square-shaped recessions in the array by at least a minimum separation distance.

In some embodiments, the plurality of recessions include an array of cross-shaped recessions. Each cross-shaped recession is separated from other cross-shaped recessions in the array by at least a minimum separation distance.

In some embodiments, the method further includes the step of fabricating a plurality of trenches proximate a rim of the wafer outside of an optical exposure region that encloses the number of device regions. Additionally, the plurality of trenches may include a grid of linear, intersecting recessions scribed in a surface of the layer.

In some embodiments, the dielectric film is a silicon nitride ($Si_3N_4$) film.

In some embodiments, the deposition of the dielectric film on the oxide layer includes the step of depositing the $Si_3N_4$ film using low-pressure chemical vapor deposition (LPCVD), in a deposition chamber maintained at a temperature of at least 700 degrees Celsius (° C.) during a portion of a single deposition run. The thickness of the $Si_3N_4$ film deposited during the single deposition run is at least 400 nanometers (nm). In some embodiments, the temperature of the deposition chamber is maintained between 750° C. and 800° C. during a portion of the single deposition run, and the thickness of the $Si_3N_4$ film deposited during the single deposition run is between 700 nm and 950 nm.

In some embodiments, the deposition of the dielectric film on the oxide layer further includes the step of depositing the $Si_3N_4$ film using low-pressure chemical vapor deposition (LPCVD), in a deposition chamber maintained at a temperature of at least 700° C. during a portion of a plurality of consecutive deposition runs. Between each deposition run, the ambient atmosphere of the deposition chamber is predominantly a Nitrogen ($N_2$) atmosphere between subsequent deposition runs in the plurality of consecutive deposition runs. In some embodiments, the ambient atmosphere of the deposition chamber can be a predominantly Argon (Ar) atmosphere. The ambient atmosphere should prevent oxidation of the dielectric film and, therefore, should contain at most only trace amounts of Oxygen ($O_2$) gas.

In some embodiments, the method further includes the step of depositing an upper-cladding layer on top of the dielectric film. In some embodiments, the upper-cladding layer is a low temperature oxide (LTO) layer.

In a second aspect of the present disclosure, a method is disclosed for fabricating a dielectric film on a wafer of semiconductor material. The method includes the steps of: depositing a first dielectric layer on an oxide layer of the wafer; fabricating a predefined pattern in the first dielectric layer of the wafer to define a number of device regions on the top surface of the wafer; and depositing a second dielectric layer on top of the first dielectric layer to increase a thickness of the dielectric film. The predefined pattern includes a plurality of recessions formed in the first dielectric layer in a portion of the wafer surrounding each of the number of device regions, and the depth of each recession in the recessions extends into the oxide layer.

In some embodiments, fabrication of the predefined pattern further includes the step of etching the predefined pattern in the first dielectric layer to a depth that extends into the oxide layer.

In some embodiments, the first dielectric layer and the second dielectric layer comprise silicon nitride ($Si_3N_4$).

In some embodiments, the first dielectric layer is deposited by low-pressure chemical vapor deposition (LPCVD) with a thickness less than 450 nanometers (nm).

In some embodiments, the maximum thickness of the first dielectric layer is adjusted by changing the deposition parameters of an LPCVD deposition chamber.

In some embodiments, the method further includes the step of patterning the dielectric film. The dielectric film includes the first dielectric layer and the second dielectric layer to form a number of devices in the device regions.

In a third aspect of the present disclosure, a semiconductor wafer for fabricating a number of devices thereon is described. The semiconductor wafer comprises a semiconductor substrate; an oxide layer including a predefined pattern formed therein to define a number of device regions on the top surface of the wafer; and a dielectric film having a thickness of at least 400 nanometers (nm) formed in at least one device region. The predefined pattern is patterned by a photolithography process, and the predefined pattern includes a plurality of recessions in the oxide layer in a portion of the wafer surrounding each of the number of device regions. The number of device regions are formed by patterning the dielectric film.

In some embodiment, the semiconductor wafer further includes a cladding layer formed on top of the dielectric film.

BRIEF DESCRIPTION OF THE DRAWINGS

FIGS. 1A-1F illustrate a process flow for fabricating thick crack-free stoichiometric silicon nitride ($Si_3N_4$) films, in accordance with an embodiment.

FIG. 3A-3C illustrate three exemplary stress-release patterns, in accordance with an embodiment.

FIG. 4A-4C illustrate a relationship between a depth of a recession pattern and a thickness of $Si_3N_4$ film, in accordance with an embodiment.

FIG. 5A illustrates a top view of a stress-release pattern surrounding devices on a substrate, in accordance with an embodiment.

FIG. 5B illustrates characteristic dimensions of the stress release pattern of FIG. 5A, in accordance with an embodiment.

FIG. 5C is a cross-sectional view of a selected region of FIG. 5A, in accordance with an embodiment.

DETAILED DESCRIPTION

Figure 2A:
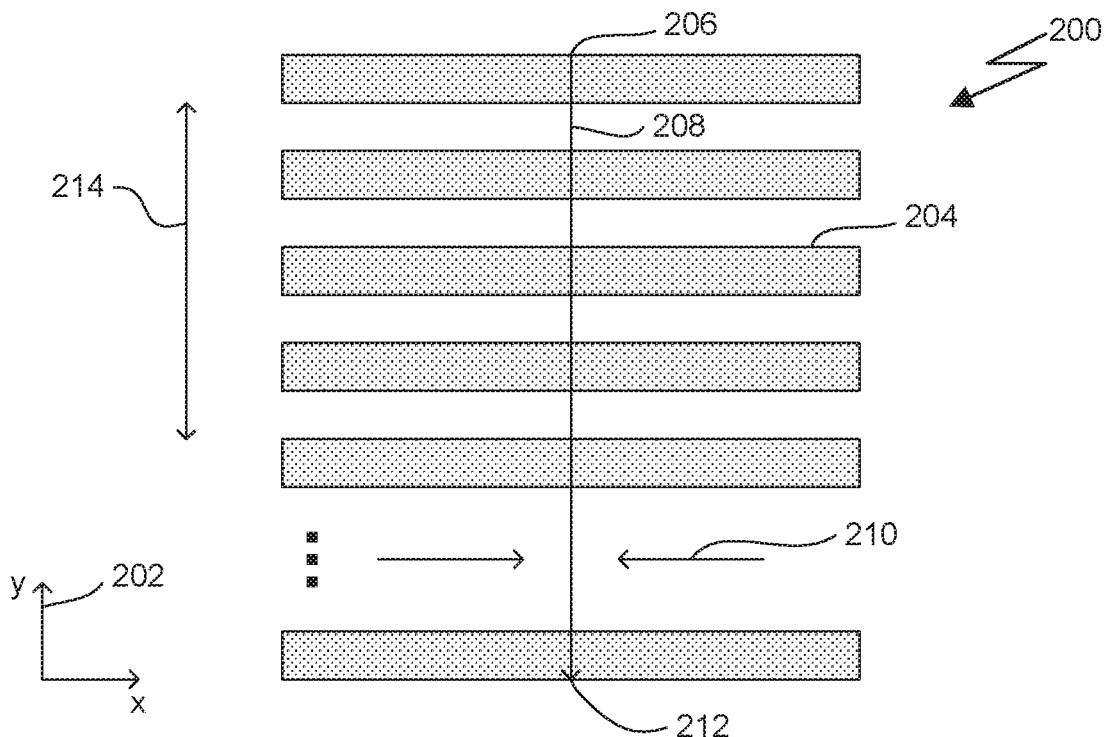
FIG. 2A illustrates a one-dimensional recession pattern for stress relaxation, in accordance with an embodiment.

A thick, crack-free dielectric film fabricated on a silicon wafer is needed for the manufacture of various types of semiconductor devices. One example of a specific application of such films is to fabricate integrated photonic devices and circuits on stoichiometric silicon nitride ($Si_3N_4$) films of approximately one micrometer (μm) thickness for nonlinear and quantum photonics on a chip. For example, photonic devices for dispersion engineering applications may need $Si_3N_4$ film to exceed 700 nm. A highly confined $Si_3N_4$ waveguide typically requires a thickness exceeding 700 nm to attain an anomalous dispersion at the 1550 nm wavelength. A $Si_3N_4$ whispering-gallery-mode (WGM) microdisk typically requires a $Si_3N_4$ thickness greater than 800 nm to attain an anomalous dispersion for transvers magnetic (TM)-polarized WGMs. However, a thick $Si_3N_4$ film deposited by LPCVD exhibits a large tensile stress, which tends to form cracks across the entire wafer. This limits the film thickness to typically less than 400 nm in order to attain reasonable device yields.

The present disclosure describes a method for fabricating a large-area, crack-free $Si_3N_4$-on-silica substrate for fabricating devices and circuits. A key step for stress control is to pattern a predefined stress-release pattern prior to the deposition of the $Si_3N_4$ film. The stress-release pattern is densely packed surrounding the device region(s). The stress-release pattern is designed with periodic recessions or steps of a high spatial frequency to interrupt the dielectric film during the deposition. Periodicity of the stress-release pattern is not necessarily being strictly followed. For example, some spots of the stress-release pattern may have varied spacing or varied linewidth. The key is to provide sufficient interruption to the deposited film. The interruption of the film prevents the driving force of the tensile stress from building up, and prevents generated cracks from propagating into the device region. The stress-release pattern is fabricated in a lower-cladding layer, followed by deposition of the $Si_3N_4$ film. Additionally, trenches may be defined around the perimeter of the wafer and/or outside the immediate vicinity of the device region(s) to further prevent cracks propagating from the rim of the wafer to the center of the wafer, proximate the device region(s). The deposition process can be adjusted with deposition conditions (e.g., a deposition rate, chamber temperature, etc.) to ensure high quality of the dielectric film. Furthermore, the $Si_3N_4$ film can be deposited by a low-pressure chemical vapor deposition (LPCVD) process at a high temperature to reduce the prevalence of N—H bonds in the $Si_3N_4$ film resulting from the presence of hydrogen in the forming gases. Some applications, such as waveguides and micro-resonators, benefit from a reduced extrinsic absorption from N—H bonds (at around 1520 nm). Still further, a layer of hard mask may be deposited after the dielectric film deposition to serve as an etching mask and to prevent the thick dielectric film from delamination. The method disclosed herein includes complementary metal-oxide-semiconductor (CMOS) compatible fabrication processes, which can be easily implemented into conventional CMOS processes for commercial use.

The fabrication process described herein provides at least the following advantages. First, the LPCVD-deposited $Si_3N_4$ film thickness can be increased, e.g., up to at least 1 µm in a single deposition run. Second, the deposited $Si_3N_4$ film can achieve a crack-free device region spanning more than 60% of the area of a 4-inch wafer. Third, essentially any device designs with a continuous area of up to a few square millimeters ($mm^2$) can be formed in the device region(s), including but not limited to waveguides, ring and disk structures, and polygonal block structures. Fourth, with an additional upper-cladding layer as an etching hard mask and a protective layer, the thick film, which is after deposition and before a subsequent patterning of devices, can last for at least half a year without delamination or further crack generation or propagation.

FIGS. 1A-1F illustrate a process flow for fabricating thick crack-free stoichiometric silicon nitride ($Si_3N_4$) films, in accordance with an embodiment.

At step 150, fabrication starts with a substrate comprising a layer of silicon (Si) 102 and a layer of silica ($SiO_2$) 104, as depicted in FIG. 1A. In an embodiment, a silicon wafer is subject to thermal oxidation to form the layer of silica on the silicon substrate. The substrate can be a 4" silicon wafer with a layer of 3 to 4 µm thermal oxide as a lower cladding layer. It will be appreciated that different substrates of various sizes may be used for fabrication, such as 4", 6", 8", or 12" wafer, or even a portion of a silicon wafer.

At step 155, the substrate is fabricated with predefined patterns 106, as shown in FIG. 1B. Device region 108 and predefined patterns 106 are fabricated on (e.g., patterned on) the $SiO_2$ layer 104. The predefined patterns 106 surround the device region 108. Fabrication of the patterns 106 may be performed in a sequence of steps comprising: (1) spin-coating of photoresist and curing the photoresist; (2) patterning by lithography; (3) developing the pattern; (4) fabricating the pattern by etching or deposition; and (5) removing the photoresist. The photoresist may be a positive photoresist or a negative photoresist. Patterning may be performed by various lithography technologies depending on feature sizes, throughputs, costs and design complexities. For example, patterning may be performed by photolithography using an aligner, a stepper, and/or a scanner. Light sources of various wavelengths may be used for exposure, such as mercury lamps at 436 nm (or "g-line"), 405 nm (or "h-line"), or 365 nm (or "i-line"), a krypton fluoride laser at 248 nm, or an argon fluoride laser at 193 nm. In one embodiment, the patterning is performed by i-line photolithography with an ASML 365 nm stepper. The stepper has a field size of 15 mm×15 mm, and a reduction ratio of 5. On a 4" wafer, the total exposure region may be 75 mm×75 mm, containing 5×5 optical exposure regions. The patterns are fabricated by etching the oxide layer 104, as illustrated in FIG. 1B. $C_4F_8/H_2$-based etchant may be used to etch the oxide layer, with a depth of a few hundreds of nanometers thicker than the target $Si_3N_4$ film thickness. In one embodiment, the pattern depth 120 may be around 1.2 µm to accommodate for the dielectric film up to around 1 µm. Trenches may be made outside the device region 108 and the predefined patterns 106 prior to the film deposition.

At step 160, the $Si_3N_4$ thick film 116 is deposited on the substrate, as illustrated in FIG. 1C. The dielectric film 116 may be uniformly deposited on the $SiO_2$ layer 104. For example, the $Si_3N_4$ film 116 may be deposited with a thickness of 950 nm in a single run using LPCVD. The LPCVD process is set at around 780° C. in a single deposition run. A slow deposition rate of 24 to 28 Å/min may be adopted for alleviation of stress in the $Si_3N_4$ film.

At step 165, a layer of low temperature oxide (LTO) 110 may be deposited on the substrate, as illustrated in FIG. 1D. The LTO layer 110 with a thickness of 700 nm may be deposited on top of the dielectric film 116. The LTO layer may be served as an etching hard mask for the $Si_3N_4$ devices. In addition, the LTO layer 110 may help with preventing the dielectric film from delamination at edges.

At step 170, device patterns 112 may be fabricated on the substrate, as illustrated in FIG. 1E. Device patterns 112 are defined on the LTO hard mask layer 110 through patterning. For example, a photoresist layer is applied to the wafer, exposed to the device patterns 112 via photolithography, and the film 116 and/or LTO layer 110 are removed outside of the device regions 108 via etching. The patterning step may be performed by i-line photolithography. Then the hardmask and the $Si_3N_4$ devices may be etched using $C_4F_8/H_2$/He and $SF_6/C_4F_8$-based etchants. The remaining LTO hardmask is removed through buffered-oxide etch (BOE). As a result, the device patterns 112 are exposed for further processes. It will be appreciated that the devices are formed in the film 116 after etching, but the devices are not recessed into the lower oxide layer 104 as in the prior art Damascene process, described above. This allows for a broader range of devices with well-controlled heights to be formed and eliminates the CMP step of the prior art techniques.

At step 175, the devices 112 formed on the substrate are clad with an LTO layer 114, as illustrated in FIG. 1F. The LTO layer 114 may be deposited on the entire substrate. Devices 112 clad with the LTO layer 114 may be used for dispersion engineering applications. After the LTO deposition, a high-temperature annealing process may be performed to minimize the H-bond absorption near 1520 nm. The annealing may be performed at 1150° C. under an $N_2$ ambient atmosphere for a number of hours. Other types of inert gas may be used in the annealing process, such as Argon gas. Significantly low trace amounts of oxygen in the inert gas ambient atmosphere prevents oxidation of the dielectric layer during the annealing process. In addition, gases with hydrogen should be avoided to prevent H-bond from forming in the dielectric film.

Figure 2B:
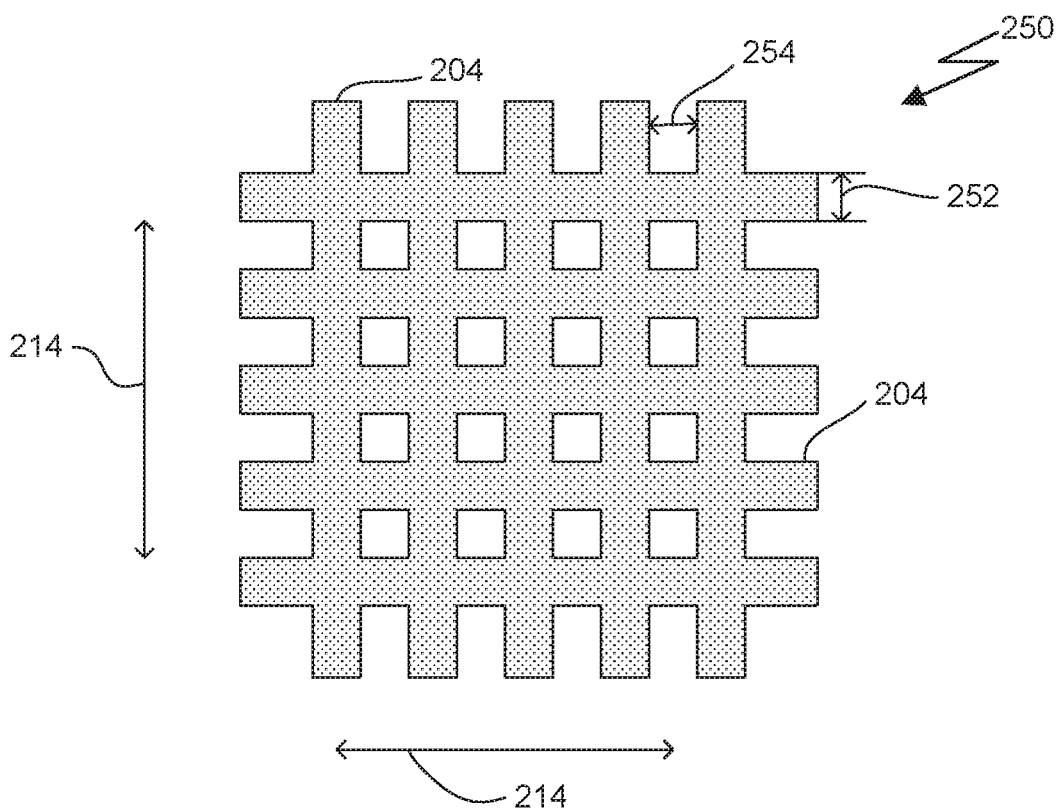
FIG. 2B illustrates a two-dimensional recession pattern for stress relaxation, in accordance with an embodiment.

Stress-release patterns are designed to ensure crack-free device regions after dielectric layer deposition. A stress-release pattern may be highly symmetric along at least one symmetry line. Designing of the stress-release pattern to be periodic is convenient for scaling and repeating. On the other hand, the stress-release pattern may be tuned locally for an optimized interruption to the deposited dielectric film. For example, some portion of the stress-release pattern may be tuned to have a higher spatial frequency and/or a wider linewidth. It is noted that periodic patterns are disclosed hereinafter for an illustrative purpose. It is by no means excluding non-periodic patterns or quasi-periodic patterns from being used as stress-release patterns. FIGS. 2A-2B illustrate, the concept of using periodic recessions to interrupt a film in one dimension 200 and in two dimensions 250, respectively.

As shown in FIG. 2A, a line-and-space pattern is distributed in a two-dimensional coordinate system 202. The lines 204 may be linearly recessed along the x-axis, and periodically spaced along the y-axis. Built-in tensile stress is relaxed in one stress relaxation direction 214, wherein the continuity of the film is interrupted along the y-axis. Assuming a crack starts at an initial spot 206. The crack propagates along a direction 208. The abruptly changing recessions along the stress relaxation direction 214 can perturb a driving force of the crack. Hence, the crack may stop propagating at an ending spot 212. On the other hand, continuity of the film along x-axis is not interrupted such that the film experiences major stress 210 along the x-axis.

FIG. 2B depicts an orthogonal cross-grid pattern 250. Recession lines 204 are distributed along the y-axis and the x-axis such that continuity of the film is interrupted along both the y-axis and the x-axis, or directions diagonal thereto. Thus, stress can be released in all in-plane stress relaxation directions 214. Characteristic dimensions for the stress-release pattern 250 are the recession pattern width 252, denoted by a, and the ridge nearest edge-to-edge distance 254, denoted by b. The characteristic dimensions a and b can be in the order of one μm to tens of μm. The smaller a and b values are, the more effective the film is interrupted, allowing a better stress-release result. On the other hand, in some embodiments, a should be at least slightly larger than twice of the dielectric film thickness. Otherwise, after a conformal deposition, the deposited film could fill the recessions. The lower limit of b is constrained by a photolithography resolution. In an embodiment, the lower limit of b can be referred to as a minimum separation distance, which can be calculated as a multiple of a pixel size of the photolithography resolution.

Patterns with a high degree of spatial symmetry and a moderately high modulation frequency can release the stress reasonably uniformly and effectively. A two-dimensional periodic recession pattern modulating with a high degree of spatial symmetry and a high spatial frequency can release the stress of the film uniformly in all in-plane directions. Additionally, some portion of the recession pattern may be finely tuned in terms of the spatial frequency and/or the linewidth of the recession pattern in order to enhance the interruption locally. The recession pattern is etched slightly deeper than the target dielectric film thickness, in order to fully release the stress across the dielectric film.

In addition, a high spatial frequency may help minimize recovery of the driving force for the cracks. Driving force of a crack needs to be lowered down to the crack resistance. Abruptly changing steps or recessions can perturb the driving force of the crack. Hence, multiple periodic abruptly changing steps can avoid the crack from recovering its driving force in an overstressed film. Design of relative shifts between adjacent rows or columns helps intercept cracks that propagate in between alternate rows and columns.

Furthermore, design parameters (e.g., a and b) of the stress-release pattern can be adjusted according to actual dimensions of the device region for an optimized result. Reducing the filling ratio of the stress-release pattern helps with enlarging the device region. Still further, in some embodiments, the stress-release pattern may be defined only at a rim of a wafer using a contact aligner to further enlarge the device region.

FIGS. 3A-3C illustrate schematically three stress-release pattern examples following the design criteria, in accordance with some embodiments.

FIG. 3A depicts a checkerboard-like stress-release pattern 300. The periodic squares 304 are recessed. The stress-release pattern 300 is symmetric about four symmetry lines 306. According to the reference coordinate system 302, the four symmetry lines are 0°, 45°, 90°, and 135° relative to the x-axis. A width 308 of the recessed square 304 is denoted by a, while lateral distance 310 between two nearest recessed squares 304 is denoted by b. The pattern may be modified into other variations in accordance with some embodiments. For example, the recessed squares 304 in the even rows may be rotated by 45°. In another example, the recessed squares 304 in the odd rows may be of different size of the ones in the even rows. Still in another example, recessed shapes in the odd rows may be squares, while the recessed shapes in the even rows may be circles. The characteristic dimensions a and b may be varied by a few micrometers in different rows and/or columns.

FIG. 3B depicts a stress-release pattern 330 of periodic crosses 332. The shapes of each cross 332 are recessed. Like the pattern 300 depicted in FIG. 3A, this periodic pattern 330 is also symmetric about four symmetry lines, which are 0°, 45°, 90° and 135° relative to the x-axis. A width 336 of the horizontal bar for each cross 332 is the same as a width 334 of the vertical bar for each cross 332, and the width 334/336 is denoted by a, while a lateral distance 338 between the nearest crosses 332 is denoted by b. It will be appreciated that, in other embodiments, the characteristic dimension b could be measured from a center of each cross 332 to the center of an adjacent cross 332, and the characteristic dimension a could be different for the vertical bars compared to the horizontal bars. A variation of the pattern 330 may be the pattern 360 illustrated in FIG. 3C, where crosses 362 in the even rows are rotated by 45° relative to the crosses 332 in the odd rows. By rotating the crosses 362 in the even rows, the symmetry of the pattern is maintained. In the pattern 360 in FIG. 3C, the smallest distance 364/368 between the nearest crosses is denoted by b.

FIG. 4A illustrates a cross-sectional view 400 of a dielectric film 406 deposited on a patterned lower-cladding layer 404, in accordance with one embodiment. The substrate comprises a layer of silicon 402 and a layer of $SiO_2$ 404. The stress-release pattern is fabricated in the $SiO_2$ layer 404, wherein the pattern comprises periodic recessions 418. Characteristic dimensions of the recession are width 414, denoted by a, depth 408, denoted by d and distance between two adjacent recessions 412, denoted by b. The characteristic dimension b may be of a few microns to provide sufficient interruptions to the dielectric film. A layer of $Si_3N_4$ 406 is uniformly deposited on top of the patterned lower-cladding layer 404. Thickness 410 of the deposited dielectric film 406 is denoted by c. In some embodiments, thickness 410 of the dielectric layer 406 is about 1 μm. After deposition, the recession 418 is filled with $Si_3N_4$, a width 414 of the recession 418 is shrunk by 2c, and both edges of the recession 418 are rounded up or sloped. A width 414 of the recession 418, or a, should be greater than 2c, in order to avoid filling the recession 418. Depending on relationship between dimensions c 410 and d 408, edges of the recession 418 after dielectric film 406 deposition will show different results. A region 416 including a recession is described in details in FIGS. 4B-4C. FIGS. 4B-4C depict results of the recession 418 after film 406 deposition under different conditions.

When d 408>c 410, the recession 414 in the substrate disrupts the dielectric film continuity in the in-plane directions sufficiently during deposition, as shown in FIG. 4B. When d 408<c 410, the depth 408 of the recession 414 is insufficient for the recession 414 in the substrate to disrupt the dielectric film 406 continuity in the in-plane directions during deposition, as shown in FIG. 4C. Therefore, the depth d 408 should be greater or equal to the thickness c 410 for best results.

A dense array of stress-release patterns may be arranged surrounding each device in the device region. FIG. 5A illustrates a portion of the wafer 500 containing a device region 502 surrounded by stress-release patterns 504. The state of the wafer 500 corresponds to the step 170 as shown in FIG. 1E. The device 502 depicted in FIG. 5A is a waveguide-coupled microdisk, which comprises a linear channel and a circular disk. A gap is between the linear channel and the circular disk, and the gap is in the order of a few hundreds of nanometers (nm). It will be appreciated that the device 502 is depicted for illustrative purposes and that the particular type and or arrangement of the device is not intended to be limiting as other types of devices are contemplated as being within the scope of the present disclosure. In one embodiment, a dense array of checkerboard-like stress-release patterns 504 are arranged surrounding a device region 502. The checkerboard-like patterns 504 can be readily stacked and densely packed to surround the device 502, and the overall stress-release area can be scaled. In the embodiment, the device region 502 can have characteristic dimensions ranging from tens of nanometers to a few millimeters. In other words, the device region 502 can have a footprint (denoted by f) as large as a few $mm^2$. The square elements of the stress-release patterns 504 are recessed. A spacing 506 (denoted by characteristic dimension e) of at least a few μm is needed to separate the stress-release patterns 504 and the device region 502. For example, e may be 30 μm. A region 520 is selected, which includes the basic elements for the checkerboard-like patterns 504, and is illustrated in FIG. 5B. A cross-sectional view along the dashed-line 530 is illustrated in FIG. 5C.

FIG. 5B depicts a zoom-in view for the selected region 520 to illustrate the basic elements for the checkerboard-like pattern 504. A width 522 of each square element of the pattern 504 is denoted by a, while a ridge spacing 524 between the recessed square elements of the pattern 504 is denoted by b. Both a and b may be of a few μm in accordance with some embodiments. In one embodiment, each square element of the pattern 504 is 5 μm-5 μm, whereas the ridge spacing 524 is 2 μm. It will be appreciated that, in other embodiments, the elements of the pattern 504 can be rectangular such that the width and height of each element is not uniform.

As illustrated in FIG. 5C, the device region 502 has a footprint 532 of a few square millimeters. Spacing 506 between the device region 502 and the stress-release pattern 504 is e, wherein e may be of at least 1 μm. Thickness of the dielectric layer c 536 may be less than 1 μm. The depth 538 of the recession element in the $SiO_2$ layer is greater than the thickness 536 of the dielectric layer (i.e., d is greater than c).

Figure 6:
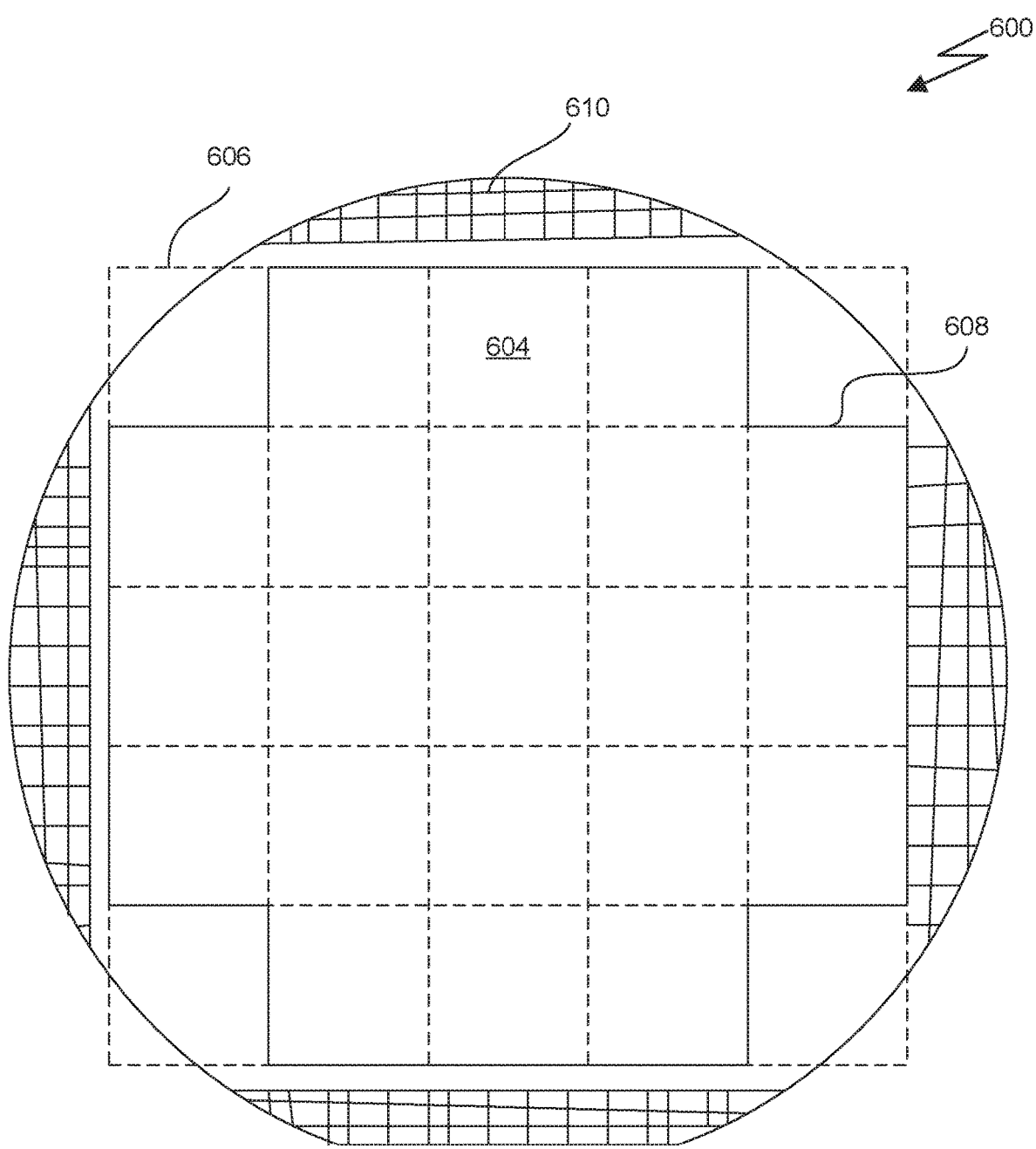
FIG. 6 illustrates devices patterned on dies on a wafer, in accordance with an embodiment.

Devices may be fabricated on a wafer in accordance with some embodiments. A crack-free region may be determined by the photolithography writing region. FIG. 6 illustrates the photolithography writing region 606 for a 4-inch wafer 600 using a stepper in one embodiment. The stepper has a field size of 15 mm×15 mm and a reduction ratio of 5. A width of a few millimeters from the rim of the wafer 600 is not usable for device fabrication, due to wafer handling. On the 4" wafer 600, the total optical exposure region 606 is 75 mm×75 mm, which includes 5×5 optical exposure regions 604 (dashed-line squares) with the same design in accordance with one embodiment. The optical exposure regions 604 at four corners are partially patterned without sufficient stress-release pattern, thus are excluded. The remaining 21 optical exposure regions in the solid line region 608 contain device region(s) and sufficient stress-release patterns, which occupies roughly 60% area of the wafer. It should be noted that one optical exposure region 604 may contain one or more devices. The optical exposure regions 604 on the wafer 600 may be associated with one or more reticles (or masks). In other words, the optical exposure regions 604 throughout the wafer 600 may or may not be of the same design.

Before dielectric film deposition, trenches may be defined outside the optical exposure region 606. As depicted in FIG. 6, grid-shape trenches 610 are defined at the rim of the wafer. The trenches may be arbitrarily scribed, either manually or automatically, at the rim by a diamond scriber, or by other methods known in the art. The trenches may prevent cracks formed at the rim of the wafer from propagating into the device region(s). Spacing of the trenches may be of a few millimeters. It is noted that the stress-release pattern may be patterned throughout the wafer by extending the writing region of the photolithography tools, such that the trenches may not be necessarily defined at the rim of the wafer (i.e., the step of defining these trenches can be omitted as the stress-release pattern performs the function of the trenches at the rim of the wafer).

Figure 7:
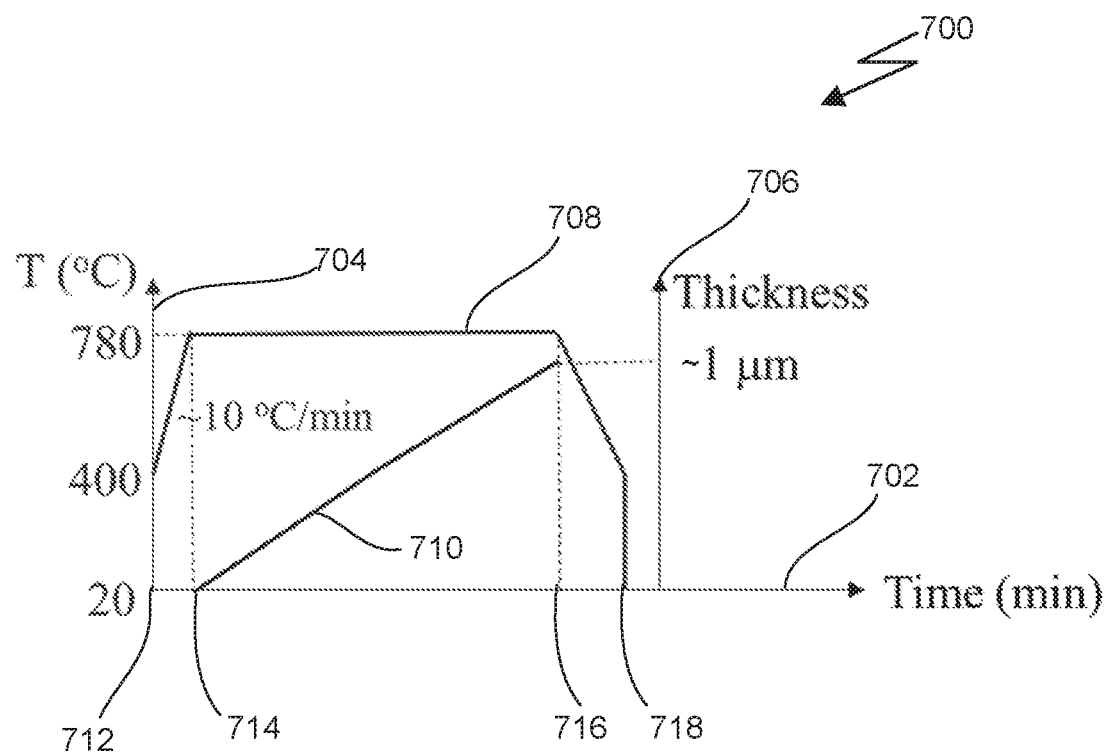
FIG. 7 illustrates change of furnace temperature and the dielectric film thickness in LPCVD deposition process, in accordance with an embodiment.

Deposition of the $Si_3N_4$ film is performed by LPCVD at around 780° C. in a single deposition run, whereby a film thickness of around 950 nm can be achieved. Two precursor gases $SiH_2Cl_2$ (DCS) and $NH_3$ at flow rates of 25 sccm and 150 sccm respectively may be adopted in the deposition of the $Si_3N_4$ film. FIG. 7 illustrates a change of furnace temperature and the deposited $Si_3N_4$ film thickness in the single deposition run in a chart 700. The horizontal axis 702 indicates time (i.e., duration of the single deposition run) in minutes (min). A first vertical axis 704 indicates temperature in degrees Celsius (° C.), whereas the second vertical axis 706 indicates thickness in micrometers (μm). A first solid line 708 in the chart 700 represents the change of furnace temperature. A second solid line 710 represents the change of $Si_3N_4$ film thickness during the deposition. At time $t_o$ 712, the furnace temperature is 400° C. and is ramping up with a speed of around 10° C./min. At time $t_1$ 714, the furnace temperature reaches 780° C. and the dielectric film starts to grow. Between time $t_1$ 714 and time $t_2$ 716, the furnace temperature is held stable at 780° C. and the dielectric film continues to grow at a controlled rate. It is noted that the deposition (between $t_1$ and $t_2$) may be performed at a different temperature and the deposition temperature is at least 700° C. At time $t_2$ 716, the deposition stops and the furnace temperature ramps down to a preset temperature at time $t_3$ 718. In an embodiment, a deposition rate of 24 to 28 Å/min is adopted for the $Si_3N_4$ film deposition. The slow deposition rate can help alleviate the tensile stress in the $Si_3N_4$ film. The foregoing parameters for the dielectric film deposition may vary upon different chamber conditions.

The deposition of the $Si_3N_4$ film using LPCVD can be carried out in two or more consecutive runs without pulling the wafer out of the deposition chamber (e.g., furnace). In between each deposition run, the wafer is kept in the deposition chamber at approximately 400° C. in an $N_2$ ambient atmosphere. As defined herein, the $N_2$ ambient atmosphere comprises predominantly nitrogen gas, by weight, but allowing for trace amounts of other gases such as carbon dioxide, methane, or oxygen. However, the combined weight of the other gases should not exceed 2% of the weight of the ambient atmosphere in the deposition chamber. Other inert ambient atmosphere may be used, such as Argon (Ar). It is important to maintain a low trace amount of oxygen in order to prevent oxidation in the dielectric layer. In addition, gases with hydrogen should be avoided to minimize the chance of forming H-bond in the dielectric film.

Figure 8:
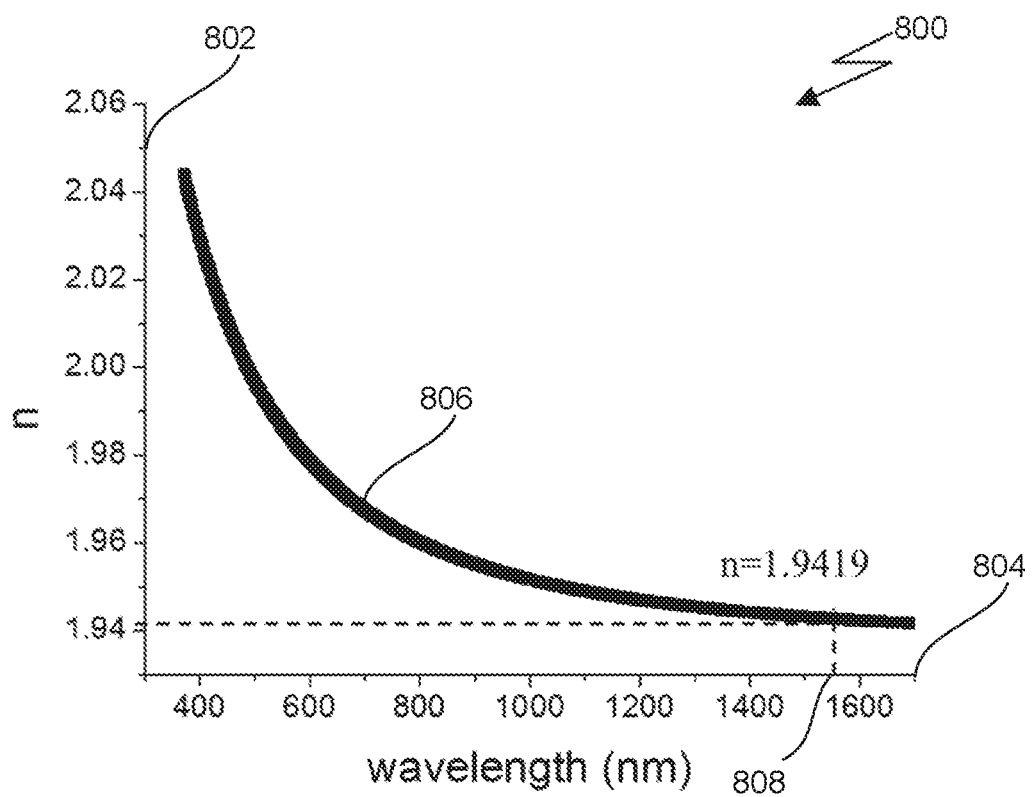
FIG. 8 shows the measured refractive index over wavelengths for a control $Si_3N_4$ film using an ellipsometer, in accordance with an embodiment.

Devices fabricated by the process disclosed herein are characterized as follows. A control film of $Si_3N_4$ is measured with refractive index for one or more wavelengths to calibrate the quality of the LPCVD deposition. The control film of $Si_3N_4$ is deposited by LPCVD, with a thickness of around 300 nm. The measurement is carried out by an ellipsometer. FIG. 8 shows a chart 800 indicating a relationship between the refractive index (n) and the wavelength (λ) for a stoichiometric film. In the chart 800, the vertical axis 802 represents the refractive index, whereas the horizontal axis 804 represents the wavelength. The curve 806 represents the relationship between n and λ. The measured refractive index for the control film of 300 nm thick $Si_3N_4$ is around 1.94 at around 1550 nm, which is consistent with the stoichiometric film. Thus, the LPCVD deposition process for fabricating devices is of good quality.

Figures 9A, 9B:
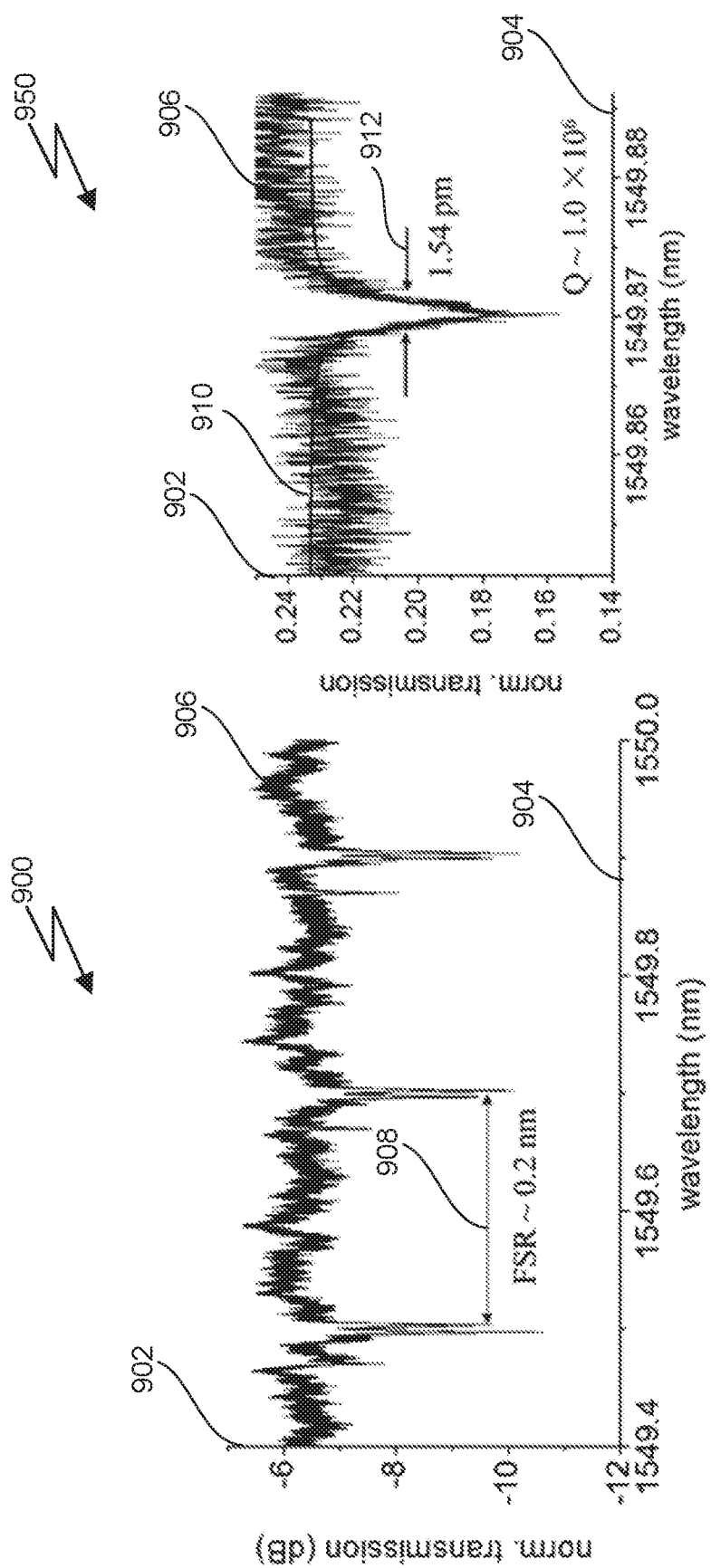
FIGS. 9A-9B show the measured resonant transmission spectrum from a waveguide-coupled $Si_3N_4$ microdisk resonator with a $Si_3N_4$ film, in accordance with an embodiment.

In an embodiment, the characterized device is a waveguide-coupled $Si_3N_4$ microdisk resonator. The microdisk resonator has a 920 μm radius and includes a 910 nm thick $Si_3N_4$ film and a 700 nm thick LTO upper-cladding layer. A laser wavelength-scanning tool in the 1550 nm wavelengths of known art is used to characterize the throughput-transmission spectra of the waveguide-coupled $Si_3N_4$ microdisk resonator. Measurement results are shown in FIGS. 9A-9B. The vertical axis 902 represents the normalized transmission optical power in dB, whereas the horizontal axis 904 represents the wavelength in nm. Measurement results are represented by 906. In FIG. 9A, a free spectral range (FSR) between two successive transmitted optical intensity minima is represented by 908. The measurement results indicates a FSR of around 0.2 nm. In FIG. 9B, a solid line 910 represents a fitting curve to the measurement results. A bandwidth 912 of 1.54 picometer (pm) is extracted from the fitting curve. The fabricated microdisk resonator reveals a resonator loaded quality (Q) factor of around $1.0 \times 10^6$.

The foregoing disclosure describes fabrication of a pre-defined stress-release pattern on a lower-cladding layer, following a single LPCVD deposition run, to achieve a thick crack-free dielectric film. The fabrication process described can achieve a $Si_3N_4$ film exceeding 400 nm of thickness. Alternatively, the stress-release pattern may be patterned between two runs of LPCVD deposition runs.

Figure 10A:
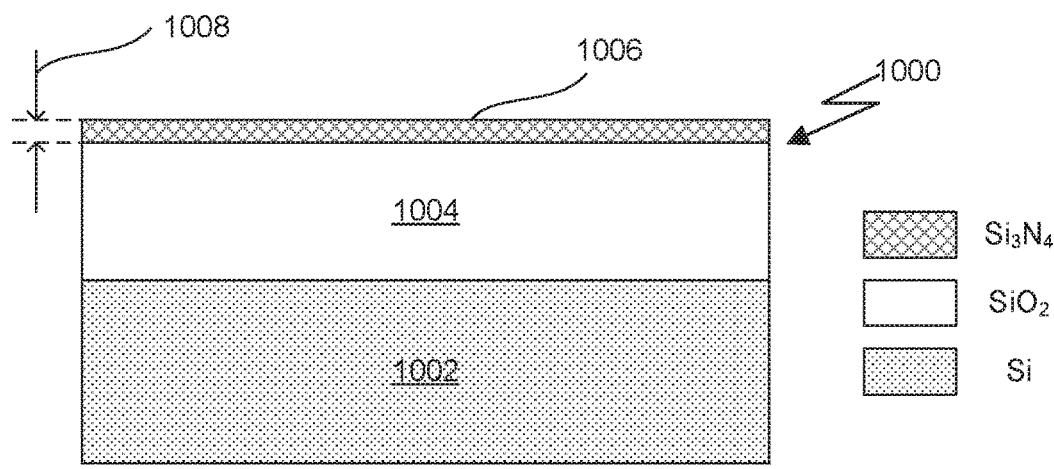
FIGS. 10A-10C illustrate a process flow for fabricating a crack-free dielectric film with two deposition runs, in accordance with an embodiment.
Figure 10B:
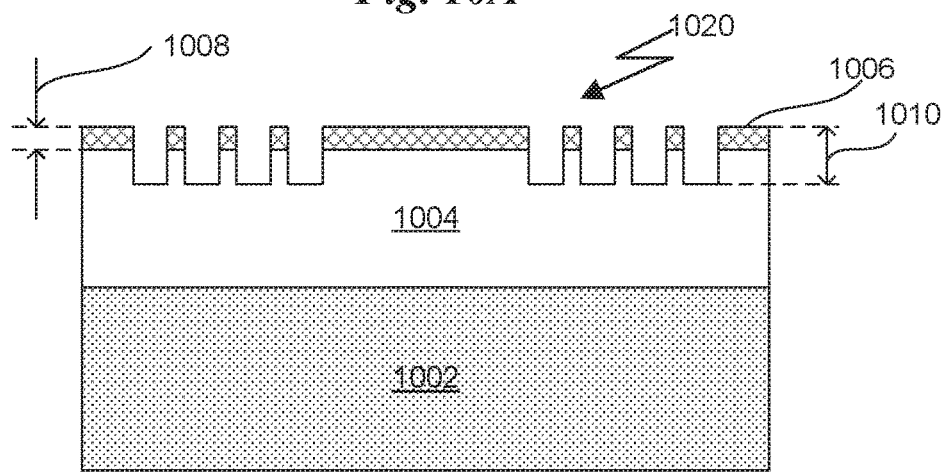
Figure 10C:
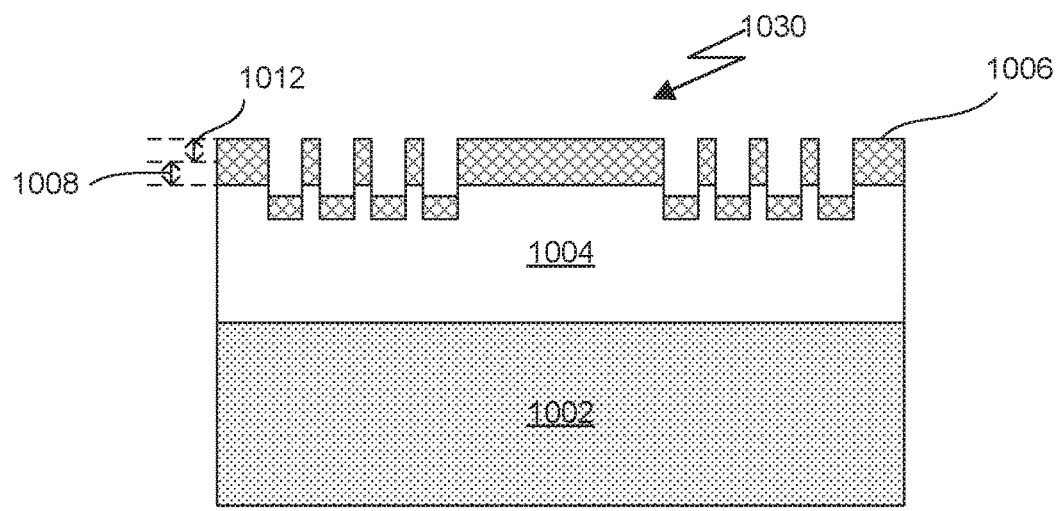

FIGS. 10A-10C illustrate the key fabrication steps for implementing the fabrication process in accordance with an embodiment. In a step 1000, a substrate comprising a silicon layer 1002 and an unpatterned lower-cladding layer of $SiO_2$ 1004 is first deposited with a layer of $Si_3N_4$ 1006, as illustrated in FIG. 10A. In this step 1000, a thin $Si_3N_4$ film of a thickness 1008 between 250 and 400 nm is deposited without forming cracks. The $Si_3N_4$ film of up to 450 nm thick may be deposited in this step 1000. At step 1020, a stress-release pattern is patterned onto the $Si_3N_4$ film 1006 and fabricated by etching the pattern down to the lower-cladding layer 1004, as illustrated in FIG. 10B. The etched depth 1010 is required to be deeper than the targeted total $Si_3N_4$ film thickness by a few hundreds of nm to ensure a sufficient stress relaxation. Subsequently, the remaining targeted $Si_3N_4$ film 1006 is deposited at step 1030, as illustrated in FIG. 10C. The actual upper thickness 1012 of deposited $Si_3N_4$ film is adjustable depending on conditions of the furnace.

It should be understood that the arrangement of components illustrated in the attached Figures are for illustrative purposes and that other arrangements are possible. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A method for fabricating a dielectric film on a wafer, comprising:
fabricating a predefined pattern in an oxide layer of the wafer to define a number of device regions on the top surface of the wafer, wherein the predefined pattern is patterned by a photolithography process, and wherein the predefined pattern comprises a plurality of recessions in the oxide layer in a portion of the wafer surrounding each of the number of device regions;
depositing the dielectric film on a top surface of the oxide layer; and
patterning the dielectric film to form a number of devices in the device regions, wherein the devices are formed above the top surface of the oxide layer in the device regions.

2. The method according to claim 1, wherein the plurality of recessions comprise a first set of linear recessions extending along a first direction and spaced along a second direction.

3. The method according to claim 2, wherein:
the plurality of recessions further comprise a second set of linear recessions extending along the second direction and spaced along the first direction; and
the second direction is orthogonal to the first direction.

4. The method according to claim 2, wherein a width of each linear recession of the predefined pattern is larger than twice the target thickness of the dielectric film.

5. The method according to claim 2, wherein a thickness of the dielectric film is smaller than a depth of the plurality of recessions in the oxide layer.

6. The method according to claim 1, wherein a predefined spacing separates each device region from the predefined pattern, and wherein the predefined spacing is at least 1 micrometer.

7. The method according to claim 1, wherein the plurality of recessions comprise:
an array of square-shaped recessions, wherein each square-shaped recession is separated from other square-shaped recessions in the array by at least a minimum separation distance; or
an array of cross-shaped recessions, wherein each cross-shaped recession is separated from other cross-shaped recessions in the array by at least the minimum separation distance.

8. The method according to of claim 1, wherein the dielectric film is a $Si_3N_4$ film.

9. The method according to claim 8, wherein depositing the dielectric film on the top surface of the oxide layer comprises:
depositing the $Si_3N_4$ film using low-pressure chemical vapor deposition (LPCVD), in a deposition chamber maintained at a temperature of at least 700 degrees Celsius (° C.) during a portion of a single deposition run,
wherein the thickness of the $Si_3N_4$ film deposited during the single deposition run is at least 400 nanometers (nm).

10. The method according to claim 8, wherein depositing the dielectric film on the top surface of the oxide layer comprises:
depositing the $Si_3N_4$ film using low-pressure chemical vapor deposition (LPCVD), in a deposition chamber maintained at a temperature of at least 700° C. during a portion of a plurality of consecutive deposition runs,
wherein between each deposition run, an ambient atmosphere is maintained in the deposition chamber for a duration between subsequent deposition runs in the plurality of consecutive deposition runs and wherein the ambient atmosphere of the deposition chamber is predominantly an inert gas atmosphere for the duration.

11. The method according to claim 10, wherein the inert gas atmosphere comprises at least one of Nitrogen ($N_2$) gas, or Argon (Ar) gas.

12. The method according to claim 1, further comprising:
depositing an upper-cladding layer on top of the dielectric film.

13. A method for fabricating a dielectric film on a wafer of semiconductor material, comprising:
depositing a first dielectric layer on an oxide layer of the wafer;
fabricating a predefined pattern in the first dielectric layer of the wafer to define a number of device regions on the top surface of the wafer, wherein the predefined pattern is patterned by a photolithography process, wherein the predefined pattern comprises a plurality of recessions formed in the first dielectric layer in a portion of the wafer surrounding each of the number of device regions, and wherein the depth of each recession in the recessions extends into the oxide layer; and
depositing, subsequent to fabricating the predefined pattern, a second dielectric layer on top of the first dielectric layer to increase a thickness of the dielectric film.

14. The method according to claim 13, wherein fabricating the predefined pattern further comprises etching the predefined pattern in the first dielectric layer to a depth that extends into the oxide layer.

15. The method according to claim 13, wherein the first dielectric layer and the second dielectric layer comprise silicon nitride ($Si_3N_4$).

16. The method according to claim 15, wherein the first dielectric layer is deposited by low-pressure chemical vapor deposition (LPCVD) with a thickness less than 450 nanometers (nm).

17. The method according to claim 16, wherein a maximum thickness of the first dielectric layer is adjusted by changing deposition parameters of an LPCVD deposition chamber.

18. The method according to claim 13, further comprising:
patterning the dielectric film comprising the first dielectric layer and the second dielectric layer to form a number of devices in the device regions.

* * * * *